US008455966B2

(12) United States Patent  
Garner et al.

(10) Patent No.: US 8,455,966 B2  
(45) Date of Patent: Jun. 4, 2013

(54) MAGNETIC PHASE CHANGE LOGIC

(75) Inventors: C Michael Garner, Pleasanton, CA (US); Dmitri E. Nikonov, Morgan Hill, CA (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 12/978,150

(22) Filed: Dec. 23, 2010

(65) Prior Publication Data

US 2012/0161261 A1 Jun. 28, 2012

(51) Int. Cl.  
*H01L 29/82* (2006.01)

(52) U.S. Cl.  
USPC ........... 257/421; 257/592; 257/423; 257/424; 257/E29.323; 257/E21.001; 365/23; 365/24; 365/32; 365/33; 365/58; 438/1; 438/3; 438/99

(58) Field of Classification Search  
USPC .................. 257/421, E29.323, 592, E21.001, 257/40, 252, 425, 423, 424; 365/23, 34, 32, 365/33, 37, 58, 158; 438/99, 1, 3  
See application file for complete search history.

(56) References Cited

U.S. PATENT DOCUMENTS

| 6,952,095 B1 * | 10/2005 | Goldfine et al. ............... 324/240 |
| 7,212,026 B2 | 5/2007 | Bourianoff |
| 7,525,862 B1 | 4/2009 | Sun et al. |
| 7,939,912 B2 | 5/2011 | Nikonov |
| 8,063,460 B2 | 11/2011 | Nikonov |
| 2006/0226926 A1 * | 10/2006 | Chui ............................. 333/1.1 |
| 2009/0218645 A1 | 9/2009 | Ranjan et al. |
| 2010/0321993 A1 | 12/2010 | Nikonov |

FOREIGN PATENT DOCUMENTS

| JP | 2009-239282 A | 10/2009 |
| WO | 2012/087986 A2 | 6/2012 |
| WO | 2012/087986 A3 | 11/2012 |

OTHER PUBLICATIONS

D. M. Newns et al., "Mott Transition Field Effect Transistor," Applied Physics Letters, 1998, pp. 780-782, vol. 73, No. 6.  
Kathrin Dorr, "Ferromagnetic Manganites: Spin-Polarized Conduction Versus Competing Interactions," J. Phys. D. Appl. Phys., 2006, pp. R125-R150, vol. 39.  
A-M Haghiri-Gosnet et al., "CMR Manganites: Physics: Thin Films and Devices," J. Phys. D: Appl. Phys., 2003, pp. R127-R150, vol. 36.  
X. Jiang et al., "Highly Spin-Poiarized Room-Temperature Tunnel Injector for Semiconductor Spintronics using MgO (100)," Physical Review Letters, 2005, pp. 056601 1-4.  
International Search Report and Written Opinion Received for PCT Patent Application No. PCT/US2011/065943 Mailed on Aug. 14, 2012, 10 pages.

* cited by examiner

*Primary Examiner* — Lynne Gurley  
*Assistant Examiner* — Cathy N Lam

(57) ABSTRACT

Provided are transistor devices such as logic gates that are capable of associating a computational state and or performing logic operations with detectable electronic spin state and or magnetic state. Methods of operating transistor devices employing magnetic states are provided. Devices comprise input and output structures and magnetic films capable of being converted between magnetic states.

8 Claims, 3 Drawing Sheets

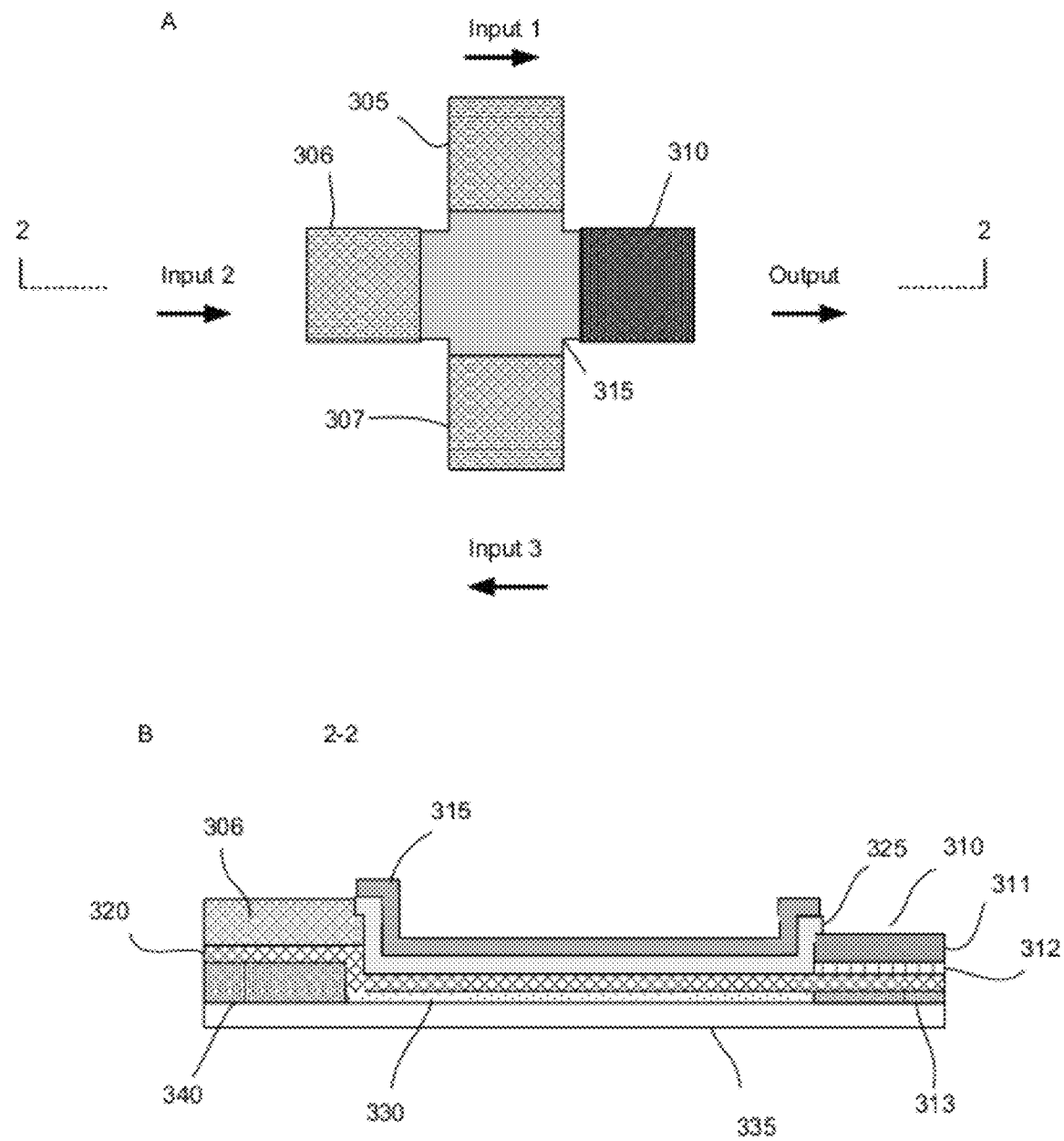
FIGURES 3A-B

MAGNETIC PHASE CHANGE LOGIC

BACKGROUND OF THE INVENTION

1. Field of the Invention

The embodiments of the present invention relate generally to semiconductor devices, semiconductor logic devices, transistors, magnetic materials, and integrated circuits.

2. Background Information

The desire for ever-smaller integrated circuits (IC) devices places enormous demands on the techniques and materials used to construct the devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 45 nm.

Components of conventional IC chips include solid-state logic devices (transistors) such as CMOS (complementary metal-oxide-semiconductor) devices that form, for example, logic gates. Generally, computing devices associate a computational state (information) with electronic charge. Logic operations within the computing device are then performed by manipulating, detecting, and storing electronic charges.

BRIEF DESCRIPTION OF THE FIGURES

FIGS. 3A and B a majority gate structure employing magnetic phase changes.

DETAILED DESCRIPTION OF THE INVENTION

Embodiments of the present invention provide transistor devices that are capable of associating a computational state and or performing logic operations using detectable electronic spin state and or magnetic state change events. Entire circuits interconnected circuits can be fabricated using magnetoelectric inputs, magnetic state logic devices, and output detection.

Figure 1:
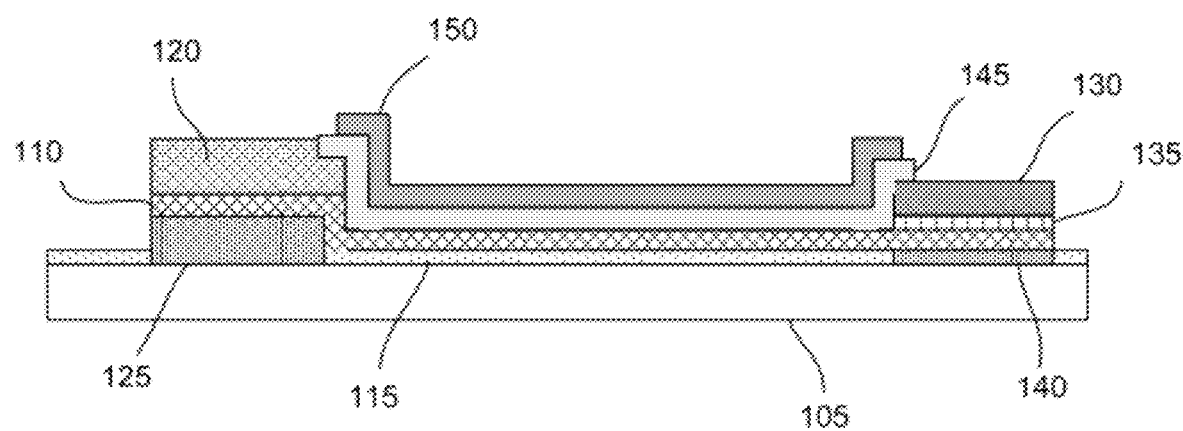
FIG. 1 illustrates a logic device employing magnetic phase changes.

FIG. 1 provides a cross-sectional view of a logic device employing variable magnetic states. In FIG. 1, a substrate 105 houses a magnetic propagation layer 110 that is capable of being converted from a paramagnetic state (a non-magnetic state or a non-magnetically aligned state) to ferromagnetic states (magnetic states or magnetically aligned states). In embodiments of the invention, the substrate 105 is a semiconductor wafer. The magnetic propagation layer 110 is an alloy or a superlattice of ferromagnetic and charge ordered materials, such as for example, a manganese oxide having the formula $Z_{1-x}M_xMnO_3$, where Z is La, Bi, and or a rare earth metal (such as, Sc, Y, La, Ce, Pr, Nd, Sm, Eu, Gd, Tb, Dy, Ho, Er, Tm, Yb, and or Lu), M is a non-trivalent doping element, such as, Ca, Sr, Ba, and or Pb, and x is an number that is greater than zero and less than 1. See, for example, "Ferromagnetic manganites: spin-polarized conduction versus competing interactions," Dorr K., *J. Phys. D: Appl. Phys.*, 39, (2006) R125-R150 and "CMR manganites: physics, thin films and devices," Haghiri-Gosnet, A-M, et al., *J. Phys. D: Appl. Phys.*, 36, (2003) R127-R150. In embodiments of the invention, the magnetic propagation layer 110 is $La_{1-x}Sr_xMnO_3$ (0.2>x<0.5) or $Pr_{1-x}Ca_xMnO_3$ (0.48>x>0.52). In addition, the modifiable magnetic material is, for example, an alloy or superlattice, such as, ferromagnetic $La_{1-x}Sr_xMnO_3$ (0.2>x<0.5), $Pr_{1-x}Ca_xMnO_3$ (0.5<x<0.75) or a charge orbital ordered material, such as, $Pr_{1-x}Ca_xMnO_3$ (0.3>x>0.5), $Nd_{0.5}Ca_{0.5}MnO_3$, $Sm_{0.5}Ca_{0.5}MnO_3$, $Pr_{0.5}Sr_{0.5}MnO_3$, $Nd_{1-x}Sr_xMnO_3$ (0.48<x>0.62), $Ln_{0.5}Ba_{0.5}MnO_3$ (where Ln is Y, Dy, Tb, Gd, Eu, or Sm). The magnetic propagation layer 110 is a layer having a thickness of between 1 nm and 30 nm.

A facilitating layer 115 is disposed between the magnetic propagation layer 110 and the substrate. In embodiments of the invention, the facilitating layer 115 that enables the growth of the magnetic propagation layer 110 on the substrate 105. The facilitating layer 115, is for example, strontium titanate ($SrTiO_3$), magnesium oxide MgO, or lanthanum aluminum oxide $LaAlO_3$. In embodiments of the invention, the substrate is comprised of $SrTiO_3$, and in further embodiments there is no separate facilitating layer in the case in which the substrate is $SrTiO_3$. The facilitating layer 115 has a thickness of between 10 nm and 1000 nm.

The magnetic propagation layer 110 is deposited on the semiconductor substrate or the facilitating layer 115 using semiconductor processing techniques, such as for example, reactive sputtering, ion beam sputtering, co-evaporation, chemical vapor deposition (CVD), reactive molecular beam epitaxy (MBE), or pulsed laser deposition (PLD). In PLD, a dense ceramic target (comprising the material to be deposited as a film) is ablated by a pulsed laser in an oxygen atmosphere, creating a plasma from which the desired film condenses onto the heated substrate.

Input for the device of FIG. 1 is provided by an input structure capable of causing the proximate section of the magnetic propagation layer 110 to convert from a non-magnetic state to a first magnetic state. The input structure is capable of creating a spin polarization of electrons in the magnetic propagation layer 110. The input structure serves as a spin injector 120 that injects polarized current into the magnetic propagation layer 110 causing, under certain conditions, which are described further herein, the conversion of the non-ferromagnetic magnetic propagation layer 110 to a ferromagnetic state. Additional description for the spin injector 120 is provided in FIG. 2 and accompanying text. The direction of current and the direction of magnetization in the spin injector 120 define direction of spin polarization which constitutes the input signal into the device. A conducting electrode 125 proximate to the spin injector 120 electrically connects the substrate 105 to a surface of the magnetic propagation layer 110 and provides the exit path for the current from the spin injector 120. The conducting electrode 125 is comprised, for example, of strontium ruthenium oxide ($SrRuO_3$), $CaRuO_3$, $LaNiO_3$, $Sr_{0.7}La_{0.3}MnO_3$, or $La_{0.5}Sr_{0.5}CoO_3$. The work function of the conducting electrode 125 is selected to drive the magnetic propagation layer 110 to a charge accumulation state that induces the conversion of regions of layer 110 proximate to the electrode 125 to a ferromagnetic state.

Output for the device of FIG. 1 is provided by an output structure that allows the spin state of the magnetic propagation layer 110 to be read. The spin state read structure (output structure) comprises a ferromagnetic layer 130, a dielectric tunnel barrier layer 135 and a second conducting electrode 140. The magnetic layer 130 comprises, in embodiment of the invention, conducting metals which are, for example, $Ni_{0.8}Fe_{0.2}$ or $CO_{0.6}Fe_{0.2}B_{0.2}$. The magnetic layer 130 can be deposited by, for example, sputter deposition. The dielectric tunnel barrier layer 135 is, for example, a layer of MgO or $Al_2O_3$. A layer of MgO can produce a high (in excess of 100%) magnetically-induced change in resistance (magnetoresistance) between the electrodes 130 and 140 in response to the relative alignment of spins in the permanent magnet 130 and the magnetic propagation layer 110. The tunnel barrier dielectric layer 135 has a thickness of between 0.5 nm and 3 nm and is deposited for example, by reactive magnetron sputtering in an argon-oxygen atmosphere, or reactive molecular beam epitaxy. Alternately, a Schottky barrier forming in the layer 110 at the interface with electrode 130 can be used in place of the tunnel barrier layer 135. The second conducting electrode 140 electrically connects the substrate 105 to a surface of the magnetic propagation layer 110. The magnetic propagation layer 110 is between the tunnel barrier dielectric layer 135 and the second conducting electrode 140. The second conducting electrode 140 is comprised of, for example, $SrRuO_3$, $CaRuO_3$, $LaNiO_3$, $Sr_{0.7}La_{0.3}MnO_3$, or $La_{0.5}Sr_{0.5}CoO_3$. In operation, a moderate voltage placed across the spin state read system allows the spin state of the magnetic propagation layer 110 to be determined through a determination of the relative resistances across the spin state read system for the magnetically aligned and the non-magnetically aligned states.

In FIG. 1, a dielectric layer 145 separates the gate electrode 150 from the magnetic propagation layer 110. The dielectric layer 145 is comprised of, for example, $SiO_2$, a low dielectric constant ("k") dielectric material, such as, silicon nitride, silicon carbide, or silicon oxynitride, although other materials are possible, and has a thickness of between 0.5 nm and 5 nm. The gate electrode 150 is optionally a clock gate electrode and is comprised of a conducting material, such as for example, copper, aluminum, platinum, palladium, and or gold.

Figure 2:
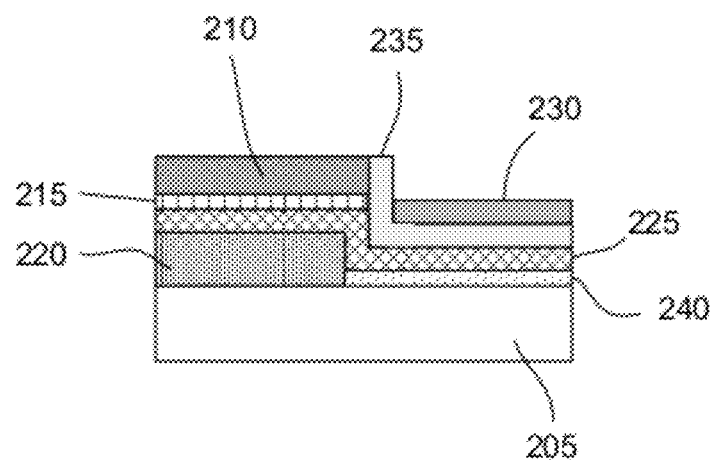
FIG. 2 provides a spin injector structure that is capable of being used with logic devices employing magnetic phase changes.

FIG. 2 shows a spin injector capable of being used with the transistor of FIG. 1. In FIG. 2, the spin injector is built on a substrate 205 and comprises a magnetic layer 210 (a permanent ferromagnet), a dielectric tunnel barrier layer 215, and a conducting electrode 220. A section of the magnetic propagation layer 225 is located between the conducting electrode 220 and the dielectric tunnel barrier layer 215. The magnetic layer 210 comprises, in embodiments of the invention, conducting ferromagnetic metals which are, for example, $Ni_{0.8}Fe_{0.2}$ or $CO_{0.6}Fe_{0.2}B_{0.2}$. The magnetic layer 210 can be deposited by, for example, sputter deposition. The dielectric tunnel barrier layer 215 is a dielectric layer through which tunneling can occur, and is for example, a layer of MgO or $Al_2O_3$. The tunnel barrier dielectric layer 215 has a thickness of between 0.5 nm and 2 nm and is deposited for example, by reactive magnetron sputtering in an argon-oxygen atmosphere or reactive molecular beam epitaxy. Alternately, a Schottky barrier can be used in place of the tunnel barrier layer 215. Alternately, a Schottky barrier forming in the layer 225 at the interface with electrode 210 can be used in place of the tunnel barrier layer 215. The conducting electrode 220 electrically connects the substrate 205 to a surface of the magnetic propagation layer 225. The magnetic propagation layer 225 is between the tunnel barrier dielectric layer 215 and the conducting electrode 220. The conducting electrode 220 is comprised of, for example, $SrRuO_3$, $CaRuO_3$, $LaNiO_3$, $Sr_{0.7}La_{0.3}MnO_3$, or $La_{0.5}Sr_{0.5}CoO_3$.

In FIG. 2 a section of the transistor device is shown that comprises a section of the gate electrode 230, and a dielectric layer 235 separates the gate electrode 230 from the magnetic propagation layer 225 as shown in and described with respect to FIG. 1. FIG. 2 also shows the facilitating layer 240 described in connection with FIG. 1.

In operation of the device described in FIGS. 1 and 2, the channel region (the region below the gate electrode 150) is placed in a frustrated state (i.e., demagnetized) by applying an effective negative gate voltage to accumulate carriers (in this case, holes) at the surface of the magnetic propagation layer 145. The voltage applied to the gate electrode is, for example, in the range of 0.5 V to 2 V. The frustrated state is one in which the effective negative gate voltage provides a driving force for the conversion of the non-ferromagnetic (or paramagnetic regions) to ferromagnetic states, however the conversion does not occur until a precipitating stimulus is applied. The precipitating stimulus comes from the injection of spin into the magnetic propagation layer 145 where the magnetic propagation layer is proximal to the spin injector 120. As the input voltage on the spin injector is made negative relative to the substrate, the spin injector injects spin polarized electrons into the magnetic propagation layer with the same polarization as the input permanent magnet (the ferromagnetic layer 210). The input voltage on the spin injector is a voltage, for example, in the range of 0.5 V to 2 V. As the magnetic polarization of the input region (of the magnetic propagation layer) aligns with the spin injector, the magnetic alignment in the input region propagates through the magnetic propagation layer where it can be detected by the output structure. The output is read at the output structure by applying a moderate voltage across the output structure. A moderate voltage is a voltage in the range of 0.1 V and 1 V. The detection of the resulting magnetic alignment at the output structure corresponds to the logic event of "1" (or "0").

In embodiments of the invention, magnetically aligned states of the magnetic propagation layer are reversed by applying a positive voltage to the gate electrode. The positive voltage for reversal of the magnetically aligned state is in a range of, for example, 0.5 V to 2 V.

Further, in operation of the device, the gate electrode is turned on and the channel region (the region below the gate electrode 150) is placed in a frustrated state by applying an effective negative gate voltage to accumulate carriers (in this case, holes) at the surface of the magnetic propagation layer 145. A voltage bias is applied to the spin injector that causes electrons to be injected into the permanent magnet from the phase separated material. The spin injector is made positive relative to the substrate. The input magnetization of the magnetic propagation layer aligns opposite to the permanent magnet of the spin injector in the area proximate to the spin injector and the magnetic alignment propagates across the channel to the output structure. The output is read at the output structure by applying a moderate voltage across the output structure. A moderate voltage is a voltage in the range of 0.1 V to 1 V. The detection of the resulting magnetic state at the output structure corresponds to the logic event of "0" (or "1").

Logic structures such as, for example, AND gates, OR gates, inverters, XOR gates, and gates with greater numbers of inputs can be constructed using the basic logic circuit described herein. Coupling between gates and other circuits is, for example, in the form of the direct coupling of inputs and outputs to a magnetic propagation layer that is continuous between gates/circuits. FIGS. 3A and B show a majority gate structure. The majority gate structure comprises three inputs 305, 306, and 307 which are each shown as having an exemplary input magnetization that leads to the detectable output 310 magnetization shown. The gate electrode 315 is above the magnetic propagation layer 320 (shown in FIG. 3B) and the magnetic propagation 320 layer extends into the inputs and the output. In general, an input of 2 or 3 of the same magnetization state yields an output of that same state. In FIG. 3A, inputs opposite those shown would provide an output opposite of that shown. In FIG. 3B a view along the line 2-2 in FIG. 3A is illustrated. A dielectric layer 325 separates the gate electrode 315 from the magnetic propagation layer 320. A facilitating layer 330 separates the magnetic propagation layer 320 from the substrate 335. Input 306 is a spin injector capable of injecting spin into the magnetic propagation layer 320. An electrode 340 electrically connects the substrate 335 to a surface of the magnetic propagation layer 320 opposite to the spin injector 306. The output structure 310 includes a magnetic layer 311 (a permanent ferromagnet), a dielectric tunnel barrier layer 312 and a second conducting electrode 313. A section of the magnetic propagation layer 320 is located between the conducting electrode 313 and the dielectric tunnel barrier layer 312.

Substrates according to embodiments of the invention are, for example, silicon wafers or silicon-on-insulator substrates. Silicon wafers are substrates that are typically used in the semiconductor processing industry, although embodiments of the invention are not dependent on the type of substrate used. The substrate could also be comprised of, for example, germanium, indium antimonide, lead telluride, indium arsenide, indium phosphide, gallium arsenide, gallium antimonide, and or other Group III-V materials either alone or in combination with silicon or silicon dioxide or other insulating materials. IC devices that make up the chip are built on the substrate surface. Devices are optionally distributed across the substrate surface and or stacked on top of each other.

Dielectric materials include, but are not limited to, silicon dioxide ($SiO_2$), low-k dielectrics, silicon nitrides, silicon carbides, and or silicon oxynitrides. A dielectric layer optionally includes pores or other voids to further reduce its dielectric constant. Typically, low-k films are considered to be any film with a dielectric constant smaller than that of $SiO_2$ which has a dielectric constant of about 3.9. Low-k films having dielectric constants of about 3 to about 2.7 are typical of current semiconductor fabrication processes. Low-k films can be, for example, boron, phosphorous, or carbon doped silicon oxides. Carbon-doped silicon oxides can also be referred to as carbon-doped oxides (CDOs) and organo-silicate glasses (OSGs).

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A device comprising,
a substrate,
a magnetic propagation layer disposed on the substrate wherein the magnetic propagation layer is capable of being converted from a non-magnetic state to a first magnetic state, a trench disposed in the magnetic propagation layer and exposed a portion of the magnetic propagation layer at a bottom of the trench,
a dielectric layer disposed on sidewalls and the bottom of the trench and an electrode wherein the dielectric layer is disposed between the electrode and the magnetic propagation layer a facilitating layer between the substrate and the magnetic propagation layer,
an input device disposed proximate to a first section of the magnetic propagation layer wherein the input device is capable of causing the proximate section of the magnetic propagation layer to convert from the non-magnetic state to the first magnetic state, and
an output device disposed proximate to a second section of the magnetic propagation layer wherein the output device is capable of detecting the magnetic state of the second proximate section of the magnetic propagation layer.

2. The device of claim 1 wherein the magnetic propagation layer is comprised of a manganese oxide having the formula $Z_{1-x}M_xMnO_3$, where Z is La, Bi, Sc, Y, La, Ce, Pr, Nd, Sm, Eu, Gd, Tb, Dy, Ho, Er, Tm, Yb, or Lu, M is Ca, Sr, Ba, or Pb, and x is a number that is greater than zero and less than 1.

3. The device of claim 1 wherein the magnetic propagation layer is additionally capable of converting to a second magnetic state and the input device is capable of causing the proximate section of the magnetic propagation layer to convert to the second magnetic state wherein the second magnetic state has a magnetic alignment different from that of the first magnetic state.

4. The device of claim 1 wherein the substrate is a semiconducting substrate.

5. The device of claim 1 wherein the facilitating layer comprises $SrTiO_3$, MgO, or $LaAlO_3$.

6. The device of claim 1 wherein the input device is comprised of a layer of permanent magnetic material, a dielectric tunnel barrier layer, and an electrode wherein the electrode electrically connects a first face of the section of the magnetic propagation layer to the substrate and wherein the dielectric tunnel barrier layer is proximate to a second face of the first section of the magnetic propagation layer and the permanent magnetic material is proximate to the dielectric tunnel barrier layer.

7. The device of claim 1 wherein the output device is comprised of a layer of permanent magnetic material, a dielectric tunnel barrier, and a conducting electrode wherein the conducting electrode electrically connects a first face of the second section of the magnetic propagation layer to the substrate and wherein the dielectric tunnel barrier layer is proximate to a second face of the second section of the magnetic propagation layer and the permanent magnetic material is proximate to the tunnel barrier layer.

8. The device of claim 1 wherein the magnetic propagation layer has a thickness of 1 nm and 30 nm.

* * * * *